(12) United States Patent
Tseng

(10) Patent No.: US 9,046,663 B2
(45) Date of Patent: Jun. 2, 2015

(54) OPTICAL COMMUNICATION DEVICE

(71) Applicant: HON HAI PRECISION INDUSTRY CO., LTD., New Taipei (TW)

(72) Inventor: Kuo-Fong Tseng, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/050,368

(22) Filed: Oct. 10, 2013

(65) Prior Publication Data

US 2014/0341502 A1 Nov. 20, 2014

(30) Foreign Application Priority Data

May 20, 2013 (TW) .............................. 102117700 A

(51) Int. Cl.
*G02B 6/42* (2006.01)
*G02B 6/43* (2006.01)

(52) U.S. Cl.
CPC ............ *G02B 6/4204* (2013.01); *G02B 6/4214* (2013.01); *G02B 6/43* (2013.01)

(58) Field of Classification Search
CPC ....................................................... G02B 6/43
USPC ........................................................... 385/14
See application file for complete search history.

(56) References Cited

U.S. PATENT DOCUMENTS

| 6,330,377 | B1 * | 12/2001 | Kosemura ........................ 385/14 |
| 6,684,007 | B2 * | 1/2004 | Yoshimura et al. ............. 385/31 |
| 8,142,672 | B2 * | 3/2012 | Hodono ........................... 216/24 |
| 2002/0061154 | A1 * | 5/2002 | Tsukamoto et al. ............ 385/14 |
| 2005/0226583 | A1 * | 10/2005 | Furuyama ...................... 385/129 |
| 2005/0276604 | A1 * | 12/2005 | Morrow et al. ................. 398/73 |
| 2007/0053627 | A1 * | 3/2007 | Hsu ................................. 385/14 |
| 2007/0223935 | A1 * | 9/2007 | Asai et al. ...................... 398/164 |
| 2007/0297713 | A1 * | 12/2007 | Lu et al. .......................... 385/14 |
| 2008/0310793 | A1 * | 12/2008 | Kodama et al. ................. 385/14 |

* cited by examiner

*Primary Examiner* — Charlie Y Peng
(74) *Attorney, Agent, or Firm* — Novak Druce Connolly Bove + Quigg LLP

(57) ABSTRACT

An optical communication device includes a planar optical waveguide, a circuit board, a light emitting element, and a light receiving element. The circuit board includes a mounting surface. Both the light emitting element and the light receiving element are supported on the mounting surface. The planar optical waveguide is buried in the circuit board. The planar optical waveguide includes a first sloped surface and a second sloped surface respectively on two opposite ends of the planar optical waveguide. The mounting surface defines a first light guide hole aligning with the first sloped surface and a second light guide hole aligning with the second sloped surface. The light emitting element is aligned with the first sloped surface through the first light guide hole. The light receiving element is aligned with the second sloped surface through the second light guide hole.

15 Claims, 1 Drawing Sheet

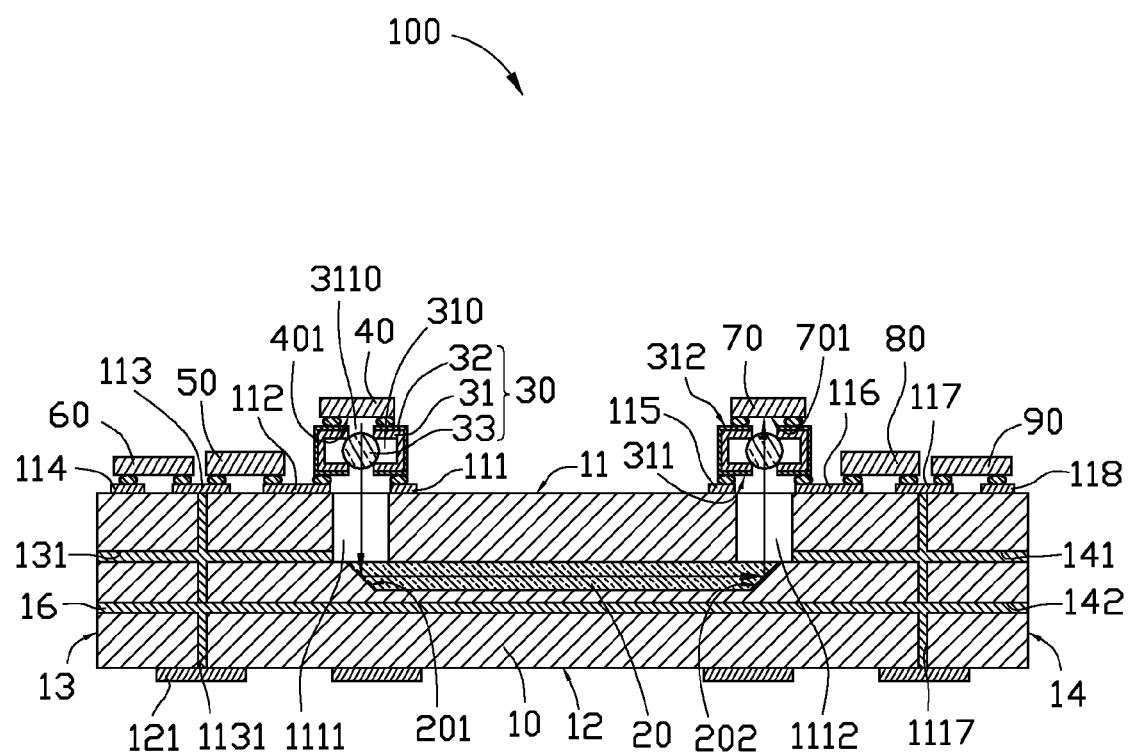

OPTICAL COMMUNICATION DEVICE

BACKGROUND

1. Technical Field

The present disclosure relates to an optical communication device.

2. Description of Related Art

Optical communication devices include a photoelectric element for emitting/receiving optical signals, a driver chip for driving the photoelectric element, a planar light waveguide for transmitting optical signals, and a lens element for optically coupling the photoelectric element to the light waveguide. To ensure an optical transmission efficiency of the optical communication device, the photoelectric element and the light waveguide need to be accurately aligned with the lens element. However, a complicated alignment mechanism and method is needed to align the photoelectric element and the light waveguide with the lens element, which increases a cost and assembling difficulty of the optical communication device.

Therefore, it is desirable to provide an optical communication device that can overcome the above-mentioned limitations.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure.

The FIGURE is a schematic view of an optical communication device, according to an exemplary embodiment of the present disclosure.

DETAILED DESCRIPTION

The FIGURE shows an optical communication device 100, according to an exemplary embodiment. The optical communication device 100 includes a circuit board 10, a planar optical waveguide 20, two light condensing assemblies 30, a light emitting element 40, a first controller 50, a processor 60, a light receiving element 70, a second controller 80, and a storing element 90.

The circuit board 10 can be made of a material such as polyimide, ceramic, or glass fiber, for example. The circuit board 10 includes a mounting surface 11, a bottom surface 12 facing away from the mounting surface 11, a first side surface 13, and a second side surface 14 facing away from the first side surface 13. The mounting surface 11 is substantially parallel with the bottom surface 12. The first side surface 13 is substantially parallel with the second side surface 14. Both the first side surface 13 and the second side surface 14 substantially perpendicularly connect the mounting surface 11 to the bottom surface 12.

The circuit board 10 includes a first connection pad 111, a second connection pad 112, a third connection pad 113, a fourth connection pad 114, a fifth connection pad 115, a sixth connection pad 116, a seventh connection pad 117, an eighth connection pad 118. The first connection pad 111, the second connection pad 112, the third connection pad 113, the fourth connection pad 114, the fifth connection pad 115, the sixth connection pad 116, the seventh connection pad 117, the eighth connection pad 118 all are formed on one end of the mounting surface 11. The first connection pad 111 is nearby the second connection pad 112. The fifth connection pad 115 is nearby the sixth connection pad 116. The circuit board 10 also includes a number of bottom connection pads 121 all formed on the bottom surface 12.

The mounting surface 11 defines a first light guide hole 1111 located between the first connection pad 111 and the second connection pad 112, a second light guide hole 1112 located between the fifth connection pad 115 and the sixth connection pad 116, a first receiving hole 1131 spatially corresponding to the third connection pad 113, and a second receiving hole 1117 spatially corresponding to the seventh connection pad 117. Both the first receiving hole 1131 and the second receiving hole 1117 run through the mounting surface 11 and the bottom surface 12.

Both the first receiving hole 1131 and the second receiving hole 1117 are filled with a conductive element 16. One end of the conductive element 16 which is received in first receiving hole 1131 is electrically connected to the third connection pad 113, while the other end of the conductive element 16 which is received in the first receiving hole 1131 is electrically connected to a bottom connection pad 121. One end of the conductive element 16 which is received in the second receiving hole 1117 is electrically connected to the seventh connection pad 117, while the other end of the conductive element 16 which is received in the second receiving hole 1117 is electrically connected to another bottom connection pad 121.

The first side surface 13 defines a third receiving hole 131 along a direction parallel with the mounting surface 11, and communicating with the first light guide hole 1111 and the first receiving hole 1131. The second side surface 14 defines a fourth receiving hole 141 along a direction parallel with the mounting surface 11, and communicating with the second light guide hole 1112 and the second receiving hole 1117. The circuit board 10 also define a fifth receiving hole 142 running through the first side surface 13 and the second side surface 14. The third receiving hole 131, the fourth receiving hole 141 and the fifth receiving hole 142 are all filled with the conductive element 16. The conductive element 16 which is received in the first receiving hole 1131 is also electrically connected to the conductive element 16 received in the third receiving hole 131 and the conductive element 16 which is received in the fifth receiving hole 142. The conductive element 16 which is received in the second receiving hole 1117 is also electrically connected to the conductive element 16 which is received in the fourth receiving hole 141 and the conductive element 16 received in the fifth receiving hole 142.

The planar optical waveguide 20 is buried in the circuit board 10. The planar optical waveguide 20 includes a first sloped surface 201 and a second sloped surface 202. Both the first sloped surface 201 and the second sloped surface 202 are respectively on two opposite ends of the planar optical waveguide 20. The mounting surface 11 faces the first sloped surface 201 at about a 45 degree angle, and aligns with the first guide hole 1111. The mounting surface 11 faces the second sloped surface 202 at about a 45 degree angle, and aligns with the second guide hole 1112.

Each light condensing assembly 30 includes a main body 31, an electric guide portion 32 coating on and covering the main body 31, and a light condensing ball 33. The main body 31 defines a receiving portion 310 for receiving the light condensing ball 33. One of the light condensing assemblies 30 is supported on the first connection pad 111 and the second connection pad 112, with the electric guide portion 32 electrically connected to the first connection pad 111 and the second connection pad 112. The other light condensing assembly 30 is supported on the fifth connection pad 115 and the sixth connection pad 116, with the electric guide portion 32 electrically connected to the fifth connection pad 115 and the sixth connection pad 116.

Each main body 31 includes a first surface 311 facing with the mounting surface 11, and a second surface 312 facing away from the first surface 311. Each main body 31 defines a through hole 3110 running through the first surface 311 and the second surface 312. The through hole 3110 communicates with the receiving portion 310. In the embodiment, the through hole 3110 is circular, a diameter of the through hole 3110 is slightly smaller than a diameter of the light condensing ball 33 for preventing the light condensing ball 33 from falling down.

The light condensing ball 33 is made of glass. In the embodiment, an angle between an optical axis of one of the light condensing balls 33 and the first sloped surface 201 is about 45 degrees. An angle between an optical axis of the other light condensing ball 33 and the second sloped surface 202 is also about 45 degrees.

The light emitting element 40 includes a light emitting surface 401. In the embodiment, the light emitting element 40 is a laser diode and is supported on an electric guide portion 32, with the light emitting surface 401 being aligned with the light condensing ball 33 and the first sloped surface 201 through the first light guide hole 1111. The light emitting element 40 is electrically connected to the first connection pad 111 and the second connection pad 112 through the electric guide portion 32.

The first controller 50 is electrically connected to the second connection pad 112 and the third connection pad 113 through a flip chip method. As such, the first controller 50 is electrically connected to the light emitting element 40 through the second connection pad 112.

The processor 60 is electrically connected to the third connection pad 113 and the fourth connection pad 114 through a flip chip method. As such, the processor 60 is also electrically connected to the first controller 50 through the third connection pad 113. The first controller 50 is located between the light emitting element 40 and the processor 60.

The light receiving element 70 includes a light receiving surface 701. In the embodiment, the light receiving element 70 is a photo diode, and is supported on the other electric guide portion 32, with the light receiving surface 701 being aligned with the light condensing ball 33 and the second sloped surface 202, through the second light guide hole 1112. The light receiving element 70 is electrically connected to the fifth connection pad 115 and the sixth connection pad 116 through the electric guide portion 32.

The second controller 80 is supported on and is electrically connected to the sixth connection pad 116 and the seventh connection pad 117 through a flip chip method. As such, the second controller 80 is electrically connected to the light receiving element 70 through the sixth connection pad 116.

The storing element 90 is supported on and electrically connected to the seventh connection pad 117 and the eighth connection pad 118 through a flip chip method. As such, the storing element 90 is also electrically connected to the second controller 80 through the seventh connection pad 117. The second controller 80 is located between the light receiving element 70 and the storing element 90. In the embodiment, the storing element 90 is a flash memory.

In use, the processor 60 sends a trigger signal to the first controller 50. The first controller 50 receives the trigger signal and generates a driving signal to drive the light emitting element 40 to emit light beams. The light beams emitted by the light emitting element 40 are condensed by the light condensing ball 33 and are directed onto the first sloped surface 201 of the planar optical waveguide 20. The first sloped surface 201 bends the light beams about 90 degrees, so that the light beams enter into the planar optical waveguide 20. The light reflects off the second sloped surface 202 and is bent about 90 degrees onto the other light condensing ball 33. The light receiving element 60 converts light signals into electrical signals, and transmits the electrical signals to the second controller 80. The second controller 80 amplifies the electrical signals. The storing element 90 stores the amplified electrical signals.

In other embodiments, both the two light condensing assemblies 30 can be omitted if the light is not required to be condensed, the light emitting element 40 is directly supported on and electrically connected to the first connection pad 111 and the second connection pad 112, while the light receiving element 70 is directly supported on and electrically connected to the fifth connection pad 115 and the sixth connection pad 116.

It will be understood that the above particular embodiments are shown and described by way of illustration only. The principles and the features of the present disclosure may be employed in various and numerous embodiment thereof without departing from the scope of the disclosure as claimed. The above-described embodiments illustrate the possible scope of the disclosure but do not restrict the scope of the disclosure.

What is claimed is:

1. An optical communication device, comprising:
a circuit board comprising a mounting surface, a first connection pad, a second connection pad, a third connection pad, and a fourth connection pad, the first connection pad, the second connection pad, the third connection pad, the fourth connection pad all being formed on one end of the mounting surface;
a light emitting element comprising a light emitting surface supported on the mounting surface, the light emitting element electrically connected to the first connection pad and the second connection pad;
a first controller supported on and electrically connected to the second connection pad and the third connection pad;
a processor, supported on and electrically connected to the third connection pad and the fourth connection pad;
a light receiving element comprising a light receiving surface supported on the mounting surface; and
a planar optical waveguide buried in the circuit board, the planar optical waveguide comprising a first sloped surface and a second sloped surface respectively on two opposite ends of the planar optical waveguide, wherein the mounting surface defines a first light guide hole aligning with the first sloped surface, and defines a second light guide hole aligning with the second sloped surface, the light emitting surface is aligned with the first sloped surface through the first light guide hole, the light receiving surface is aligned with the second sloped surface through the second light guide hole.

2. The optical communication device of claim 1, wherein the mounting surface faces the first sloped surface at about a 45 degree angle.

3. The optical communication device of claim 1, wherein the mounting surface faces the second sloped surface at about a 45 degree angle.

4. The optical communication device of claim 1, wherein the first light guide hole is located between the first connection pad and the second connection pad.

5. The optical communication device of claim 1, comprising a light condensing assembly, wherein the light condensing assembly is supported on and electrically connected to the first connection pad and the second connection pad, the light emitting element is supported on and electrically connected to the light condensing assembly.

6. The optical communication device of claim 5, comprising a second controller and a storing element, wherein the circuit board comprises a fifth connection pad, a sixth connection pad, a seventh connection pad, and an eighth connection pad, the fifth connection pad, the sixth connection pad, the seventh connection pad, the eighth connection pad all are formed on one end of the mounting surface, the light receiving element is electrically connected to the fifth connection pad and the sixth connection pad, the second controller is supported on and electrically connected to the sixth connection pad and the seventh connection pad, the storing element is supported on and electrically connected to the seventh connection pad and the eighth connection pad.

7. The optical communication device of claim 6, comprising an another light condensing assembly, wherein the another light condensing assembly is supported on and electrically connected to the fifth connection pad and the sixth connection pad, the light receiving element is supported on and electrically connected to the another light condensing assembly.

8. The optical communication device of claim 7, wherein each light condensing assembly comprises a main body, an electric guide portion coating on and covering the main body, and a light condensing ball, the main body defines a receiving portion receiving the light condensing ball, the light condensing ball of one light condensing assembly aligns with the first sloped surface, and the light condensing ball of another condensing assembly aligns with the second sloped surface.

9. The optical communication device of claim 8, wherein an angle between an optical axis of one of the light condensing balls and the first sloped surface is about 45 degrees, an angle between an optical axis of the other light condensing ball and the second sloped surface is about 45 degree.

10. The optical communication device of claim 8, wherein each main body comprises a first surface facing the mounting surface and a second surface facing away from the first surface, each main body defines a through hole running through the first surface and the second surface, the through hole communicates with the receiving portion, the through hole is circular, a diameter of the through hole is slightly smaller than a diameter of the light condensing ball.

11. The optical communication device of claim 6, wherein the circuit board comprises a bottom surface and a plurality of bottom connection pads formed on the bottom surface.

12. The optical communication device of claim 11, comprising a conductive element, wherein the circuit board defines a first receiving hole spatially corresponding to the third connection pad and a second receiving hole spatially corresponding to the seventh connection pad, both the first receiving hole and the second receiving hole run through the mounting surface and the bottom surface, both the first receiving hole and the second receiving hole are filled with the conductive element, one end of the conductive element received in first receiving hole is electrically connected to the third connection pad, while the other end of the conductive element received in the first receiving hole is electrically connected to a bottom connection pad, one end of the conductive element received in the second receiving hole is electrically connected to the seventh connection pad, while the other end of the conductive element received in the second receiving hole is electrically connected to the another bottom connection pad.

13. The optical communication device of claim 12, wherein the circuit board comprises a first side surface and a second side surface, the first side surface is substantially parallel with the second side surface, both the first side surface and the second side surface substantially perpendicularly connect to the mounting surface to the bottom surface, the first side surface defines a third receiving hole along a direction parallel with the mounting surface, and communicating with the first light guide hole and the first receiving hole, the second side surface defines a fourth receiving hole along a direction parallel with the mounting surface, and communicating with the second light guide hole and the second receiving hole, the third receiving hole and the fourth receiving hole are filled with the conductive element.

14. The optical communication device of claim 13, wherein the circuit board defines a fifth receiving hole running through the first side surface and the second side surface, the fifth connection pad is filled with the conductive element, the conductive element received in the first receiving hole is also electrically connected to the conductive element received in the third receiving hole and the conductive element received in the fifth receiving hole, the conductive element received in the second receiving hole is also electrically connected to the conductive element received in the fourth receiving hole and the conductive element received in the fifth receiving hole.

15. The optical communication device of claim 1, wherein the light emitting element is a laser diode, the light receiving element is a photo diode.

* * * * *